US012119258B2

(12) United States Patent
Augendre et al.

(10) Patent No.: US 12,119,258 B2
(45) Date of Patent: Oct. 15, 2024

(54) SEMICONDUCTOR STRUCTURE COMPRISING A BURIED POROUS LAYER FOR RF APPLICATIONS

(71) Applicants: COMMISSARIAT À L'ENERGIE ATOMIQUE ET AUX ÉNERGIES ALTERNATIVES, Paris (FR); Soitec, Bernin (FR)

(72) Inventors: Emmanuel Augendre, Grenoble (FR); Frédéric Gaillard, Grenoble (FR); Thomas Lorne, Grenoble (FR); Emmanuel Rolland, Grenoble (FR); Christelle Veytizou, Bernin (FR); Isabelle Bertrand, Bernin (FR); Frédéric Allibert, Grenoble (FR)

(73) Assignees: Soitec, Bernin (FR); COMMISSARIAT À L'ENERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 235 days.

(21) Appl. No.: 17/623,499

(22) PCT Filed: Mar. 25, 2020

(86) PCT No.: PCT/EP2020/058316
§ 371 (c)(1),
(2) Date: Dec. 28, 2021

(87) PCT Pub. No.: WO2021/001066
PCT Pub. Date: Jan. 7, 2021

(65) Prior Publication Data
US 2022/0359272 A1    Nov. 10, 2022

(30) Foreign Application Priority Data
Jul. 2, 2019 (FR) .................... 1907328

(51) Int. Cl.
*H01L 21/00* (2006.01)
*H01L 21/02* (2006.01)
(Continued)

(52) U.S. Cl.
CPC .. *H01L 21/76254* (2013.01); *H01L 21/02164* (2013.01); *H01L 21/02203* (2013.01); *H01L 23/64* (2013.01)

(58) Field of Classification Search
CPC ......... H01L 21/02203; H01L 21/02164; H01L 21/76254
See application file for complete search history.

(56) References Cited

U.S. PATENT DOCUMENTS

2002/0102777 A1* 8/2002 Sakaguchi ........ H01L 21/02307
257/E21.216
2004/0262686 A1* 12/2004 Shaheen ........... H01L 21/76254
257/347
(Continued)

FOREIGN PATENT DOCUMENTS

CN    107408532 A    11/2017
FR    2977075 A1    12/2012
(Continued)

OTHER PUBLICATIONS

"Neutral." Merriam-Webster.com. 2023. https://www.merriam-webster.com/dictionary/neutral (Dec. 28, 2023). (Year: 2023).*
(Continued)

*Primary Examiner* — Reema Patel
(74) *Attorney, Agent, or Firm* — TraskBritt

(57) ABSTRACT

A semiconductor structure for radio frequency applications includes a support substrate made of silicon and comprising a mesoporous layer, a dielectric layer arranged on the mesoporous layer and a superficial layer arranged on the dielectric layer. The mesoporous layer comprises hollow
(Continued)

pores, the internal walls of which are mainly lined with oxide. The mesoporous layer has a thickness between 3 and 40 microns and a resistivity greater than 20 kohm·cm over its entire thickness. The support substrate has a resistivity between 0.5 and 4 ohm·cm. The invention also relates to a method for producing such a semiconductor structure.

20 Claims, 3 Drawing Sheets

(51) Int. Cl.
*H01L 21/762* (2006.01)
*H01L 23/64* (2006.01)

(56) References Cited

U.S. PATENT DOCUMENTS

| | | | |
|---|---|---|---|
| 2017/0062284 A1 | 3/2017 | Mason et al. | |
| 2017/0221839 A1 | 8/2017 | Kononchuk et al. | |
| 2018/0047614 A1 | 2/2018 | Usenko | |
| 2018/0315814 A1* | 11/2018 | Fan | H01L 21/7605 |

FOREIGN PATENT DOCUMENTS

| | | |
|---|---|---|
| JP | 2017-532758 A | 11/2017 |
| JP | 2018-509002 A | 3/2018 |
| WO | 2012/176031 A1 | 12/2012 |
| WO | 2016/016532 A1 | 2/2016 |
| WO | 2016/149113 A1 | 9/2016 |
| WO | 2018/137937 A1 | 8/2018 |

OTHER PUBLICATIONS

Japanese Office Action for Application No. 2021-578062 dated Oct. 10, 2023, 2 pages.
International Search Report for International Application No. PCT/EP2020/058316 dated Jun. 18, 2020, 3 pages.
International Written Opinion for International Application No. PCT/EP2020/058316 dated Jun. 18, 2020, 6 pages.
Kononchuk et al., Silicon-on-Insulator Soi Technology: Manufacture and Applications (Woodhead Publishing Series in Electronic and Optical Materials), sections 10.7 and 10.8, (Jun. 2014).
Taiwan Office Action for Application No. 109109850 dated Mar. 30, 2023, 3 pages.

* cited by examiner

SEMICONDUCTOR STRUCTURE COMPRISING A BURIED POROUS LAYER FOR RF APPLICATIONS

CROSS-REFERENCE TO RELATED APPLICATIONS

This application is a national phase entry under 35 U.S.C. § 371 of International Patent Application PCT/EP2020/058316, filed Mar. 25, 2020, designating the United States of America and published as International Patent Publication WO 2021/001066 A1 on Jan. 7, 2021, which claims the benefit under Article 8 of the Patent Cooperation Treaty to French Patent Application Serial No. 1907328, filed Jul. 2, 2019.

TECHNICAL FIELD

The present disclosure relates to the field of semiconductor materials for microelectronic components. The present disclosure relates to, in particular, an SOI substrate structure including a buried mesoporous silicon layer that is suitable for high-performance radiofrequency devices, in particular, in terms of thermal stability and linearity.

BACKGROUND

Radiofrequency (RF) devices find wide use in the field of telecommunications (cellular telephony, Wi-Fi, BLUETOOTH®, etc.). These devices are produced on substrates in the form of wafers that serve mainly as supports for the fabrication thereof. However, the increase in the degree of integration and the expected performance of these RF devices has led to an increasingly tighter coupling of their performance and the properties of the substrate on which they are formed.

By way of example of device/substrate coupling, the electromagnetic fields generated by high-frequency signals propagating through the RF devices penetrate into the bulk of the substrate and interact with any charge carriers found there. This leads to problems of nonlinear distortion (harmonics) in the signal, wasteful consumption of some of the power of the signal through insertion loss and possible crosstalk between devices.

Thus, in most applications involving the transmission or reception of radiofrequency signals (10 MHz to 100 GHz), RF device fabrication requires a substrate that meets an increasingly demanding set of specifications, in particular, resulting from the evolution of mobile telephony standards (2G, 3G, LTE, LTE Advanced, LTE Advanced PRO, etc.). The properties of the materials for the substrate must provide, in particular:
- low insertion losses (low attenuation of the signal) and good linearity (low distortion of the signal, cause of harmonics), typically achieved via an effective resistivity, over the entire frequency range, which is higher than 1000 ohm·cm;
- stability of the aforementioned performance with temperature, in particular, in the operating range of the RF devices [−40° C.; 150° C.];
- low capacitive coupling between the active layer and the carrier substrate, typically achieved by virtue of a dielectric permittivity that is equal to or lower than that of silicon ($\varepsilon_{silicon}$=11.7);
- and, of course, good mechanical strength, compatible with the production of microelectronic devices.

Moreover, to meet the need for high volumes, the substrate must be compatible with the semiconductor industry, and, in particular, with silicon CMOS fabrication lines. It must in addition be competitive in terms of cost in order to be adopted in mass-market applications, in particular, in the field of telecommunications (cellular telephony, Wi-Fi connectivity, BLUETOOTH®, etc.).

Radiofrequency (RF) devices, such as antenna adapters and switches, power amplifiers, low-noise amplifiers or even passive (R, L, C) components may be produced on various types of substrates.

Substrates based on high-resistivity silicon comprising a carrier substrate, a trapping layer arranged on top of the carrier substrate, a dielectric layer arranged on top of the trapping layer and an active semiconductor layer arranged on top of the dielectric layer are known. The resistivity of the carrier substrate is usually higher than 1 kohm·cm. The trapping layer may comprise undoped polysilicon. Combining a high-resistivity carrier substrate with a trapping layer according to the prior art makes it possible to decrease the device/substrate coupling mentioned above and thus to ensure the good performance of RF devices. In this regard, the person skilled in the art will find a review of the performance of RF devices fabricated on a known prior-art high-resistivity semiconductor substrate in "Silicon-on-insulator (SOI) Technology, manufacture and applications," sections 10.7 and 10.8, Oleg Kononchuk and Bich-Yen Nguyen, published by Woodhead Publishing.

Nevertheless, a polysilicon trapping layer has the drawback of undergoing partial recrystallization in high-temperature heat-treatment steps, which contributes to decreasing the density of traps in the layer. Because changing standards in mobile telephony dictate increasingly demanding specifications for RF components, the negative effect on the performance of a device caused by this decrease in trap density is unacceptable for certain applications.

One alternative to this polysilicon trapping layer is a layer of porous silicon. Document US2017062284 proposes an SOI structure comprising a porous layer under buried oxide (BOX) but does not specify the range of thicknesses and the porosity characteristics that make it possible to achieve the desired levels of mechanical strength and RF performance. Application WO2016/016532 proposes an SOI structure including a very thin mesoporous layer, of less than 1 µm in thickness: this structure affords the required mechanical strength and good radiofrequency performance, unlike the porous layers of greater thickness (of between 10 µm and 80 µm) conventionally proposed in the prior art, on which subject document WO2016/016532 indicates a mechanical strength that is incompatible with some of the steps in the fabrication of the devices and with the prerequisites for a carrier for the final operational devices.

To address this problem of mechanical strength, document WO2016/149113 proposes filling the pores of the porous layer with amorphous or polycrystalline silicon, or with silicon oxide.

BRIEF SUMMARY

The present disclosure provides an alternative solution to those of the prior art. The present disclosure relates to, in particular, an SOI structure including a mesoporous silicon layer that is suitable for high-performance radiofrequency devices.

The present disclosure relates to a semiconductor structure for radiofrequency applications comprising:

a carrier substrate made of silicon including a mesoporous layer;

a dielectric layer arranged on top of the mesoporous layer; and a surface layer arranged on top of the dielectric layer.

The semiconductor structure is noteworthy in that:

the mesoporous layer includes hollow pores, the internal walls of which are coated with oxide; furthermore, the thickness of the mesoporous layer is between 3 µm and 40 µm and the resistivity of this layer is higher than 20 kohm·cm throughout the entire thickness thereof; and the resistivity of the carrier substrate is between 0.5 ohm·cm and 4 ohm·cm.

According to other advantageous and non-limiting features of the present disclosure, considered alone or in any technically feasible combination:

the thickness of the mesoporous layer is less than 20 µm;

the resistivity of the carrier substrate is between 1 ohm·cm and 2 ohm·cm;

the surface layer is formed of at least one material chosen from silicon, germanium, silicon carbide, IV-IV, III-V or II-VI semiconductor compounds and piezoelectric materials (for example, $LiNbO_3$, $LiTaO_3$, etc.);

the porosity of the mesoporous layer is between 40% and 60%, and, preferably, about 50%; and the semiconductor structure comprises radiofrequency devices produced in and/or on the surface layer.

The present disclosure also relates to a process for fabricating a semiconductor structure for radiofrequency applications, comprising:

a step a) of providing a donor substrate including a buried weakened plane that delimits a surface layer with respect to the front face of the donor substrate;

a step b) of providing a carrier substrate made of silicon exhibiting a resistivity of between 0.5 ohm·cm and 4 ohm·cm;

a step c) of porosifying the carrier substrate in order to form a mesoporous layer in a front portion of the carrier substrate, the mesoporous layer exhibiting a resistivity of higher than 20 kohm·cm and being between 3 µm and 40 µm thick;

a step d) of annealing the carrier substrate under an oxidizing atmosphere at a temperature of between 300° C. and 400° C. so as to stabilize the mesoporous layer with hollow pores the internal walls of which are coated with oxide;

a step e) of depositing a dielectric layer on top of the mesoporous layer;

a step f) of attaching the donor substrate, via the front face thereof, to the dielectric layer; and a step g) of separating along the buried weakened plane in order to transfer the surface layer to the carrier substrate.

According to other advantageous and non-limiting features of the present disclosure, considered alone or in any technically feasible combination:

the resistivity of the silicon carrier substrate is between 1 ohm·cm and 2 ohm·cm;

the porosification in step c) is carried out electrochemically;

the duration of the anneal under an oxidizing atmosphere in step d) is between 5 min and 200 min;

step d) comprises, after the anneal under an oxidizing atmosphere, an anneal under a neutral atmosphere at a temperature of between 400° C. and 450° C., and advantageously at 420° C.;

the duration of the anneal under a neutral atmosphere in step d) is between two hours and 16 hours, and, preferably, 10 hours; and step g) comprises a separating heat treatment carried out at a temperature of between 200° C. and 500° C., and advantageously at 400° C.

BRIEF DESCRIPTION OF THE DRAWINGS

Other features and advantages of the present disclosure will become apparent from the following detailed description of embodiments of the present disclosure, which description is given with reference to the accompanying figures, in which.

and

Figure 7:
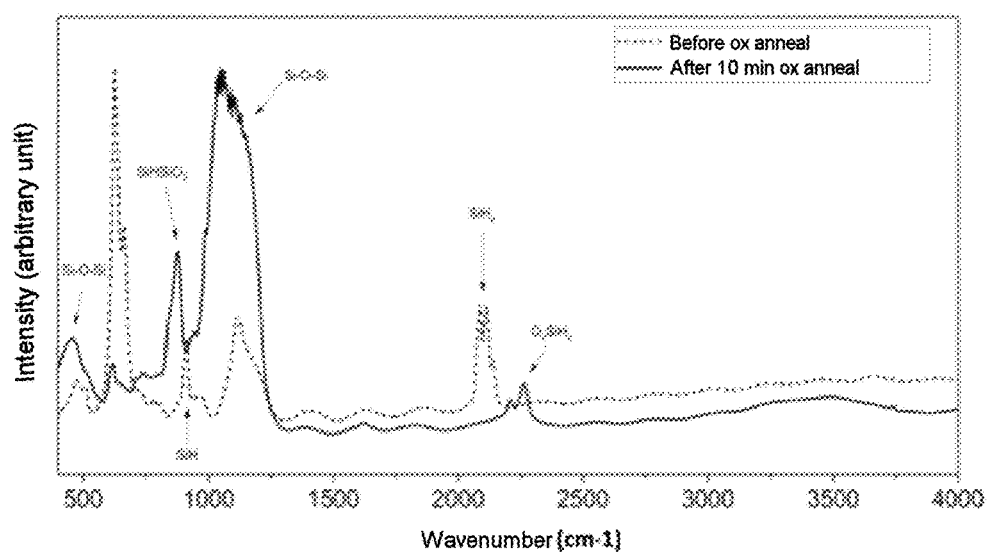

FIG. 7 shows the changes in the chemical bonds in the mesoporous layer after the stabilizing anneal in step d).

DETAILED DESCRIPTION

In the description, the same reference signs in the figures might be used for elements of the same type. The figures are schematic representations that, for the sake of legibility, are not to scale. In particular, the thicknesses of the layers along the z-axis are not to scale with respect to the lateral dimensions along the x- and y-axes; and the relative thicknesses of the layers with respect to one another are not necessarily respected in the figures. It should be noted that the coordinate system (x,y,z) of FIG. 1 applies to FIG. 2.

The present disclosure relates to a semiconductor structure 10 for radiofrequency applications.

Figure 1:
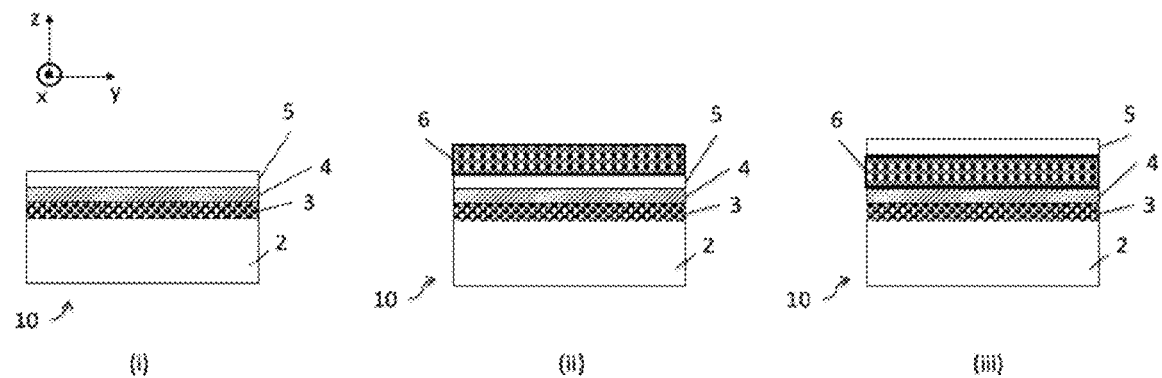
FIG. 1 shows semiconductor structures according to the present disclosure.

The semiconductor structure 10 first includes a carrier substrate 2 of silicon, the resistivity of which is between 0.5 ohm·cm and 4 ohm·cm, and, preferably, between 1 ohm·cm and 2 ohm·cm (FIG. 1). The carrier substrate 2 includes a layer of mesoporous silicon 3. It is recalled that there are three types of morphology for porous silicon: macroporous silicon (pore diameter greater than 50 nm); mesoporous silicon (pore diameter between 2 nm and 50 nm); and nanoporous silicon, also referred to as microporous silicon (pore diameter less than 2 nm).

The mesoporous layer 3 according to the present disclosure has hollow pores, the internal walls of which are mostly coated with oxide; the thickness of the oxide layer on the internal walls of the pores is typically about a nanometer. The term "hollow pores" is understood to mean pores that are not filled with a solid material such as silicon oxide, for example. The oxide coating of the internal walls of the pores confers a stabilized state on the mesoporous layer 3, in which Si-Hx dangling bonds have mostly been replaced with much more stable Si—O—Si bonds. The mechanical strength of the mesoporous layer 3 is enhanced thereby.

Advantageously, the porosity of the mesoporous layer 3 is between 40% and 60%, and, preferably, at 50%. This porosity provides a good balance between mechanical properties and electrical properties for the mesoporous layer 3.

The resistivity of the mesoporous layer 3 is higher than 20 kohm·cm throughout the entire thickness thereof; this high resistivity is related to, in particular, the particular resistivity range chosen for the carrier substrate 2, as will be described further below in conjunction with the process for fabricating the semiconductor structure 10.

Furthermore, the thickness of the mesoporous layer 3 is between 3 μm and 40 μm, and advantageously less than 20 μm. The thickness of the mesoporous layer 3, together with its morphology (pore stability, porosity), will define the mechanical strength of the layer 3. A range of characteristics has been selected that provide the mesoporous layer 3 with the mechanical strength suitable for supporting the fabrication of the semiconductor structure 10 and for being retained in the final operational device.

In addition, the thickness of the mesoporous layer 3, in combination with its very high resistivity that is stable with temperature from −40° C. to 225° C., provides the semiconductor structure 10 with the resistivity and insulation properties required for high-performance radiofrequency applications.

The semiconductor structure 10 also comprises a dielectric layer 4 arranged on top of the mesoporous layer 3. Advantageously, but without being limiting, the dielectric layer 4 will comprise at least one of the materials from: silicon dioxide, silicon nitride, aluminum oxide, etc. The thickness thereof will vary between 10 nm and 3 μm.

The semiconductor structure 10 further comprises a surface layer 5 arranged on top of the dielectric layer 4 (FIG. 1—(i)). The surface layer 5 is formed of at least one material chosen from silicon, germanium, silicon carbide, IV-IV, III-V or II-VI semiconductor compounds and piezoelectric materials (for example, $LiNbO_3$, $LiTaO_3$, etc.). A typical thickness of this layer is between a few nanometers and a few microns, advantageously between 200 nm and 1500 nm.

Radiofrequency microelectronic devices 6 could then be produced in and/or on the surface layer 5 of the semiconductor structure 10 (FIG. 1—(ii)). The RF devices 6 could comprise, for example, switching circuits ("switches"), antenna-matching or -tuning circuits ("tuners") or power amplification circuits ("power amplifiers"), produced using microelectronics technologies. The fabrication of microelectronic components may require several steps to be carried out, including high-temperature heat treatments that are typically at 950° C. to 1100° C., or even higher. The mesoporous layer 3 described above retains its physical (mechanical strength) and electrical (resistivity, ability to trap charge carriers) properties after such heat treatments.

According to one variant, the semiconductor structure 10 comprises a layer of RF devices 6 on top of the dielectric layer 4 and the surface layer 5 is located on top of the devices 6 (FIG. 1—(iii)). This configuration may be obtained, for example, when the layer of RF devices 6 is produced in or on the surface layer 5 while this surface layer is still attached to a donor substrate. The assembly formed by the layer of RF devices 6 and the surface layer 5 may then be transferred to the dielectric layer 4 using a layer transfer technique that could be chosen from the Smart Cut™ method or a method combining bonding and chemical-mechanical thinning of the donor substrate.

Whichever the variant of the semiconductor structure 10, the electromagnetic fields arising from the high-frequency signals that are intended to propagate through the RF devices 6, and which will penetrate into the mesoporous layer 3 and into the carrier substrate 2, suffer only small losses (insertion losses) and a little interference (crosstalk, harmonics) by virtue of the high resistivity and stability with temperature (typically up to about 225° C.) of the mesoporous layer 3.

The low permittivity of the mesoporous layer 3 (about half that of silicon, taking the porosity of about 50% into account) also promotes low capacitive coupling with the RF devices 6.

The stability of RF performance of the semiconductor structure 10 is also promoted by virtue of the electromagnetic fields penetrating less deeply for a given thickness of mesoporous layer 3 (low permittivity) and by virtue of the electrical properties of the carrier substrate 2 not changing within the operating temperature range (resistivity of 0.5-4 ohm·cm versus high-resistivity substrate of the prior art).

The present disclosure also relates to a process for fabricating the semiconductor structure 10 illustrated in FIG. 1—(i).

Figure 2:
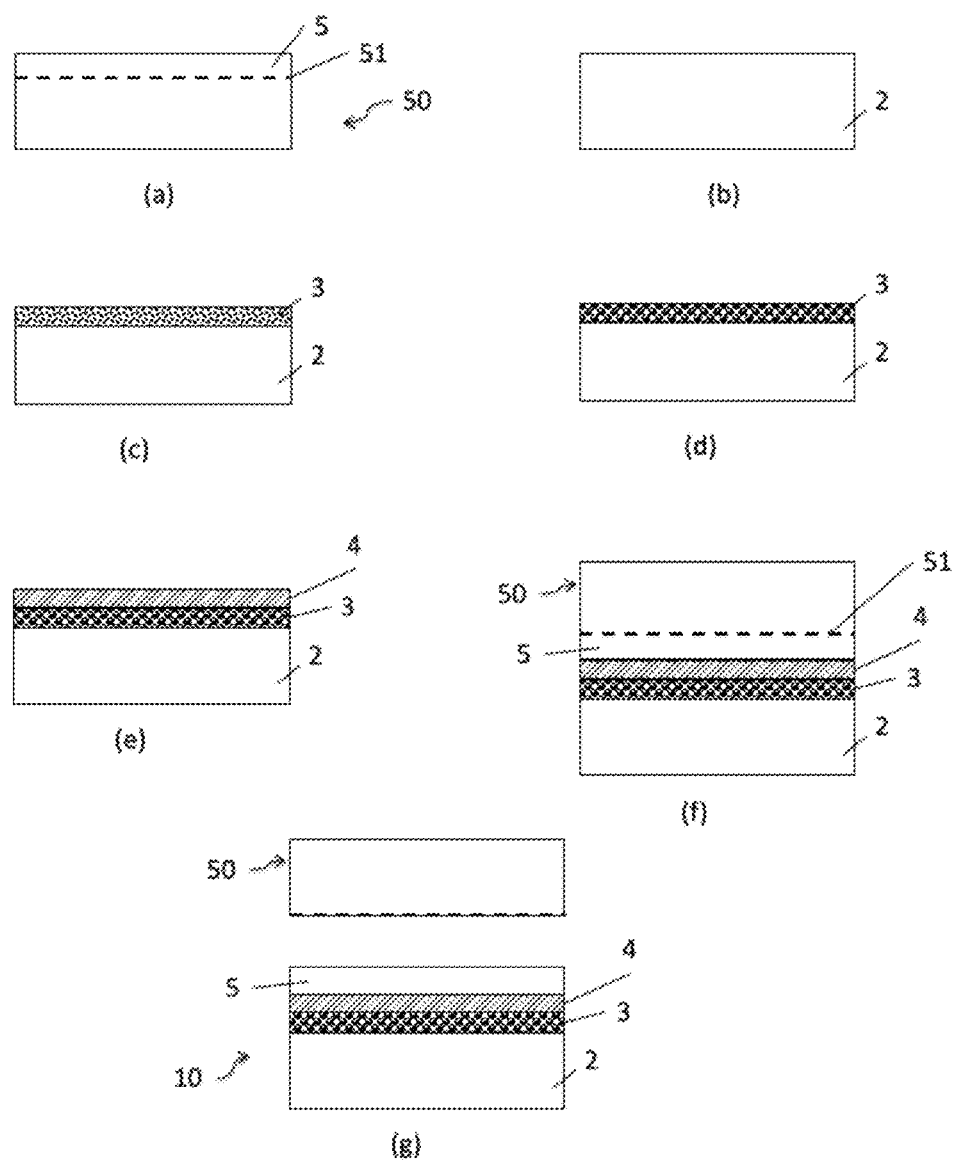
FIG. 2 shows a process for fabricating a semiconductor structure according to the present disclosure.

The process comprises a first step a) of providing a donor substrate 50 including a buried weakened plane 51 that delimits a surface layer 5 with respect to the front face of the donor substrate 50 (FIG. 2—(a)).

The donor substrate 50 may be formed of at least one material chosen from silicon, germanium, silicon carbide, IV-IV, III-V or II-VI semiconductor compounds and piezoelectric materials (for example, $LiNbO_3$, $LiTaO_3$, etc.). The donor substrate 50 may further include one or more additional layers arranged on the front face and/or on the back face thereof, which may be of any nature, for example, dielectric (not shown in FIG. 2—(a)).

The buried weakened plane 51 is advantageously formed by ion-implanting light species into the donor substrate 50 at a defined depth. The light species are preferably chosen from hydrogen and helium, or a combination of hydrogen and helium, since these species promote the formation of microcavities around the defined implantation depth, resulting in the buried weakened plane 51, as described in the well-known Smart Cut™ method.

By way of example, in the case of a donor substrate 50 made of silicon including an additional layer of silicon oxide on the surface with a thickness of between 10 nm and 400 nm, hydrogen ions could be implanted at an implantation energy of between 76 keV and 160 keV and a dose of between $1^e17/cm^2$ and $1.5^e17/cm^2$ in order to form the buried weakened plane 51 and to define a surface layer with a thickness of between 400 nm and 1500 nm.

The process also comprises a step b) of providing a carrier substrate 2 (FIG. 2—(b)). The carrier substrate 2 is made of silicon and its resistivity is between 0.5 ohm·cm and 4 ohm·cm. This very narrow resistivity range has been defined so as to produce, in the next step c), a mesoporous layer 3 of high resistivity and suitable porosity. The resistivity range of the carrier substrate 2 is, preferably, even restricted to between 1 ohm·cm and 2 ohm·cm.

It should additionally be noted that silicon substrates with a resistivity of between 0.5 ohm·cm and 4 ohm·cm (or between 1 ohm·cm and 2 ohm·cm) are widely available in comparison with the substrates of very high resistivity (>1 kohm·cm) that are typically used in radiofrequency applications.

The process next comprises a step c) of porosifying the carrier substrate 2 in order to form a mesoporous layer 3 in a front portion of the carrier substrate 2 (FIG. 2—(c)).

Figure 3:
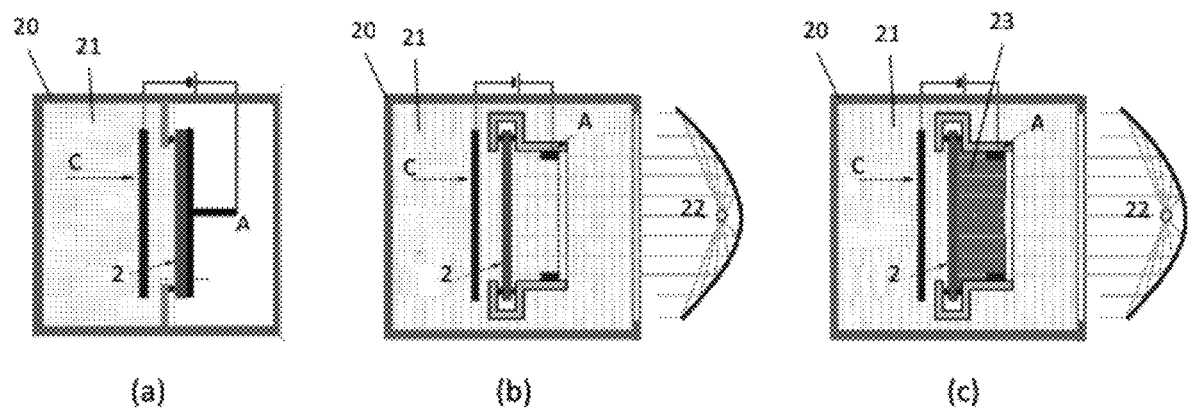
FIG. 3 shows several options for carrying out the porosification step in the fabrication process according to the present disclosure.

The porosification step is carried out electrochemically or photoelectrochemically. It is based on anodic dissolution in an acidic medium using the silicon of the carrier substrate 2 (FIG. 3). In practice, the carrier substrate 2 is immersed in a solution 21 based on hydrofluoric acid. The carrier substrate 2 is in contact with an anode A and a cathode C is positioned facing the face of the carrier substrate 2 to be porosified.

Various configurations of experimental device 20, referred to as single—(FIG. 3—(a)) or dual—(FIG. 3—(b), (c)) cell configurations, are available. In the first case, only the front face of the carrier substrate 2 is immersed in the solution 21. In the second case, the front and back faces of the carrier substrate 2 are in contact either with the same HF solution 21 or with different solutions 23. In the dual-cell case, the back face may be illuminated 22 in order to replace a doped layer in contact with the anode.

When it is placed in the experimental device 20, the carrier substrate 2 undergoes electrolysis: the current density is advantageously between 1 mA/cm$^2$ and 50 mA/cm$^2$; the HF concentration of the solution 21 is higher than 30% and advantageously comprises an additive (for example, isopropyl alcohol (IPA) or ethanol). A mesoporous layer 3 is thus formed from the front face of the carrier substrate 2 (FIG. 2—(c)). The porosification time defines the thickness of the layer 3.

Figure 4:
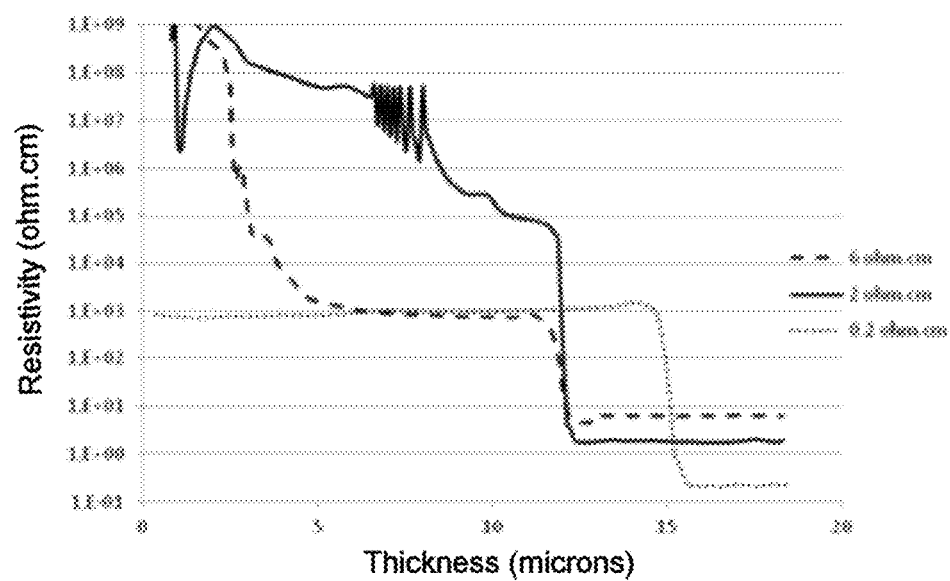
FIG. 4 shows measurements of the resistivity of mesoporous layers according to the thickness thereof.

Surprisingly, it has been observed that only the narrow resistivity range of between 0.5 ohm·cm and 4 ohm·cm, and advantageously between 1 ohm·cm and 2 ohm·cm, for the carrier substrate 2 is able to confer a high resistivity (higher than 20 kohm·cm) on the mesoporous layer 3 throughout its entire thickness. This observation was first made using SRP (spreading resistance profiling) measurements allowing the resistivity of the mesoporous layer 3 to be measured throughout its thickness. Exemplary SRP measurements for mesoporous layers with thicknesses of 12 µm, 12 µm and 15 µm produced on carrier substrates 2 with resistivities of 6 ohm·cm, 2 ohm·cm and 0.2 ohm, respectively, are shown in FIG. 4. The carrier substrate 2 with a resistivity of 2 ohm·cm allows a very high resistivity to be reached for the mesoporous layer 3 throughout its thickness, unlike for the other resistivities tested. A very narrow resistivity range, namely between 0.5 ohm·cm and 4 ohm·cm, has been identified for the carrier substrate 2, which allows a resistivity of higher than 20 kohm·cm to be reached throughout the thickness of the mesoporous layer 3 according to the present disclosure. It should be noted that a resistivity range of between 1 ohm·cm and 2 ohm·cm for the carrier substrate 2 is more preferable for achieving a high resistivity (>20 kohm·cm) for the mesoporous layer 3 throughout the entirety of its thickness.

This observation has been confirmed by what are known as second harmonic distortion (HD2) characterization measurements on the same carrier substrates 2 provided with mesoporous layers measured by SRP. This measurement is carried out at 900 MHz for an output power of 15 dBm on coplanar lines with a length of 2 mm. Second harmonic distortion (HD2) characterization, a detailed description of which is found in document US2015/0168326, is straightforward to implement since it does not require the complete fabrication of a radiofrequency device 6 on the semiconductor structure 10; furthermore, it is particularly suitable because it is highly representative of the performance of a radiofrequency device 6, which might be formed on top of the carrier substrate 2 being characterized, in particular, in or on the surface layer 5 of the semiconductor structure 10.

Figure 5:
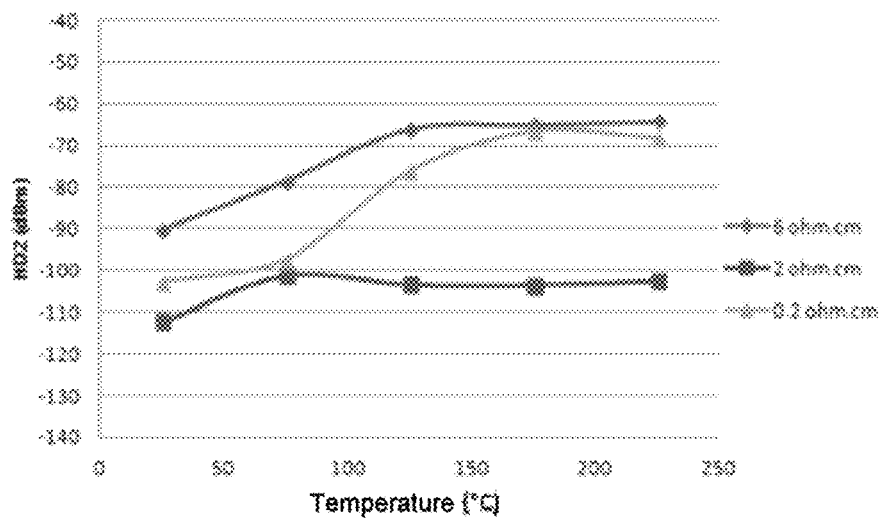
FIG. 5 shows characterizations of second harmonic distortion (HD2) on carrier substrates provided with mesoporous layers according to operating temperature.

FIG. 5 shows second harmonic distortion (referred to as HD2) measurement in dBm with operating temperature in a range from 20° C. to 225° C. It should be noted that the RF performance of the carrier substrates 2 provided with mesoporous layers 3 does not deteriorate, or hardly deteriorates, toward the lowest operating temperatures (down to −70° C.).

To guarantee very high performance (for example, required for 5G mobile applications) for the RF devices 6 that will be produced in and/or on the surface layer 5 of the semiconductor structure 10, the HD2 values must be lower than −95 dBm, and advantageously lower than −100 dBm. It is observed that the carrier substrate 2 with a resistivity of 2 ohm·cm provided with its mesoporous layer 3 is the only one to exhibit the desired behavior over the entire operating temperature range. The mesoporous layer 3 produced on a carrier substrate 2 with a resistivity of between 0.5 ohm·cm and 4 ohm·cm (preferably, between 1 ohm·cm and 2 ohm·cm) exhibits the required characteristics of high resistivity throughout its thickness and stability within the operating temperature range.

The mesoporous layer 3 must furthermore be at least 10 µm thick in order to achieve the targeted RF performance. This minimum thickness has been identified by carrying out second harmonic distortion characterization measurements on carrier substrates 2 with various thicknesses of the mesoporous layer 3. This measurement has been carried out under the same conditions as those mentioned above.

Figure 6:
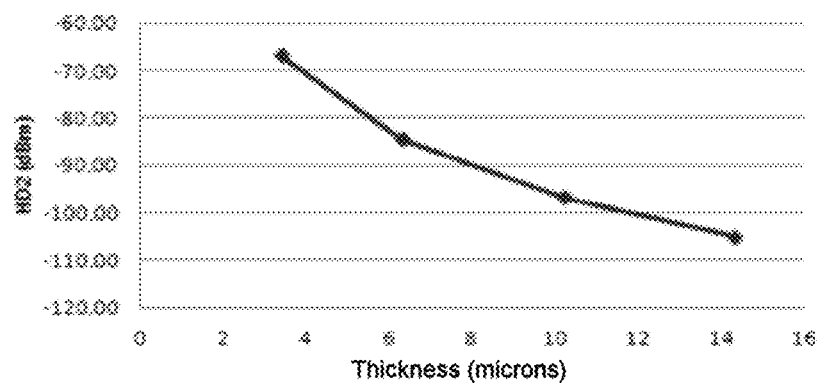
FIG. 6 shows characterizations of second harmonic distortion (HD2) on carrier substrates provided with mesoporous layers according to the thickness of the mesoporous layer.

The x-axis on the graph of FIG. 6 gives the thickness of the mesoporous layer 3 in microns. The y-axis gives the HD2 measurement in dBm. To be below a target HD2 value of −95 dBm, the thickness of the mesoporous layer 3 must be greater than 10 µm+/−0.5 µm.

It should be noted that, for less demanding applications in terms of RF performance, an HD2 value of about −90 dBm or even −80 dBm could be targeted. The thickness of the mesoporous layer 3 could then be decreased, as can be seen in FIG. 6: for example, to provide an HD2 value of −80 dBm, a thickness of 6 µm+/−0.5 µm would be sufficient. The mesoporous layer 3 then guarantees this performance over the entire operating temperature range.

Since increasing the thickness of the mesoporous layer 3 would negatively affect its mechanical strength, a range of thicknesses has been defined that is compatible with the subsequent steps in the fabrication of the semiconductor structure 10 and with the steps in the fabrication of the RF devices 6, namely between 3 µm and 40 µm, and advantageously less than 20 µm.

The mesoporous layer 3, produced on a carrier substrate 2 made of silicon, the resistivity of which is within the narrow ranges mentioned above, further exhibits a porosity of between 40% and 60%, and, preferably, about 50%.

After porosification step c), the fabrication process comprises a step d) of annealing the carrier substrate 2 under an oxidizing atmosphere at a temperature of between 300° C. and 400° C. in order to stabilize the mesoporous layer 3 (FIG. 2—(d)). Preferably, the duration of the anneal under an oxidizing atmosphere is between 5 min and 200 min.

This anneal allows most of the Si-Hx dangling bonds, in particular, present on the internal walls of the pores, to be replaced with much more stable Si—O—Si bonds, as can be seen in FIG. 7. FIG. 7 shows the absorption spectrum, obtained using Fourier-transform infrared spectroscopy, of the Si-Hx and Si—O species present in the mesoporous layer 3 before and after a stabilizing anneal under an oxidizing atmosphere. The disappearance of the peaks relating to Si-Hx bonds in favor of more stable Si—O bonds following an anneal under an oxidizing atmosphere at 300° C. for 10 min should be noted.

As mentioned above, the pores of the mesoporous layer 3 according to the present disclosure remain hollow and their inner walls are coated with a thin layer of oxide, the thickness of which is about a nanometer, resulting in a stabilized state for the mesoporous layer 3.

Advantageously, step d) comprises, after the anneal under an oxidizing atmosphere, an anneal under a neutral atmosphere at a temperature of between 400° C. and 500° C., and advantageously at 420° C. The duration of the anneal under a neutral atmosphere is typically between two hours and 16 hours, and ideally 10 hours.

Carrying out step d) prevents, in particular, any degassing during the heat treatments that are applied to the semiconductor structure 10 later on, degassing potentially negatively affecting the quality of the semiconductor structure 10; additionally, the curvature ("bow") of the carrier substrate 2 provided with the mesoporous layer 3 is stabilized and the curvature of the semiconductor structure 10 varies little after the heat treatments.

The fabrication process next comprises a step e) of depositing a dielectric layer 4 on top of the mesoporous layer 3 (FIG. 2—(e)). Advantageously, but without being limiting, the dielectric layer 4 will comprise at least one of the materials from: silicon dioxide, silicon nitride, aluminum oxide, etc. The dielectric layer 4 is obtained, for example, by way of thermal oxidation, or LPCVD, PECVD or HDP deposition. The thickness thereof could vary between 10 nm and 3 μm.

It should be noted that the dielectric layer 4 could be produced entirely on the mesoporous layer 3 or, alternatively, partly on the mesoporous layer 3 and partly on the donor substrate 50; in this second case, the dielectric layer 4 exhibits its total thickness after the subsequent attachment step f).

The process comprises a step f) of attaching the donor substrate 50, via the front face thereof, to the dielectric layer 4 (FIG. 2—(f)). The attachment operation may be carried out using any known method, preferably, by way of direct bonding by molecular adhesion. This well-known prior-art technique will not be described in detail here. However, it is recalled that, prior to attachment, the donor substrate 50 and the carrier substrate 2 will have undergone conventional surface-activation and/or cleaning sequences in order to guarantee the quality of the bonding interface in terms of defects and bonding energy.

The next step g) in the process comprises separating along the buried weakened plane 51 in order to transfer the surface layer 5 to the carrier substrate 2 and thus to obtain the semiconductor structure 10 and the remainder of the donor substrate 50 (FIG. 2—(g)). Preferably, step g) comprises a separating heat treatment carried out at a temperature of between 200° C. and 500° C. Such a heat treatment is capable of increasing the degree of weakening of the buried weakened plane 51, which effect is fundamental to the Smart Cut™ method well known to those skilled in the art.

A temperature of about 400° C. is advantageous in that the assembly is subjected to fewer stresses related to the different coefficients of expansion of the materials in the donor substrate 50, in the dielectric layer 4, in the mesoporous layer 3 and in the carrier substrate 2. Specifically, overly high stresses may affect the integrity of the mesoporous layer 3. The mechanical strength of the semiconductor structure 10 being maintained is therefore also subject to carrying out separating step g) such that a low level of stresses is applied to the donor substrate 50/carrier substrate 2 assembly.

After separation, step g) could include heat treatments for finishing the surface layer 5 for the purpose of improving the crystal and surface quality thereof (roughness, defects). The semiconductor structure 10 tolerates heat treatments well, even at high temperatures (from 900° C. to 1100° C. or even 1200° C.), in particular, because the mesoporous layer 3 has been stabilized in step d).

The semiconductor structure 10 is also compatible with the heat and chemical treatments that are typically applied when fabricating radiofrequency microelectronic devices. The mesoporous layer 3 affords adequate mechanical strength and is not subject to changes that might affect its physical and electrical properties, thereby providing:

low insertion losses (low attenuation of the signal) and a good linearity (low distortion of the signal, cause of harmonics);

stability of this performance with temperature, in particular, in the operating range of the RF devices [−40° C.; 150° C.] and even up to about 225° C.; and low capacitive coupling between the RF devices 6 in/on the surface layer 5 and the carrier substrate 2, typically achieved by virtue of a dielectric permittivity that is lower than that of silicon.

The semiconductor structure 10 for radiofrequency applications according to the present disclosure is thus suitable for any application in which high-frequency signals are propagated, which may be subject to losses or unwanted interference in a carrier substrate 2, since the physical and electrical characteristics of the mesoporous layer 3 arranged on the carrier substrate 2 provide the assembly with good RF and mechanical properties.

Of course, the present disclosure is not limited to the described embodiments and examples, and variant embodiments thereof may be envisaged that do not depart from the scope of the invention such as defined by the claims.

The invention claimed is:

1. A semiconductor structure for radiofrequency applications, comprising:
a carrier substrate comprising silicon and including a mesoporous layer, the mesoporous layer including hollow pores, internal walls of the hollow pores being coated with oxide, the hollow pores not being completely filled with a solid material a thickness of the mesoporous layer being between 3 μm and 40 μm, a resistivity of the mesoporous layer being higher than 20 kohm·cm throughout the entire thickness of the mesoporous layer, a resistivity of the carrier substrate being between 0.5 ohm·cm and 4 ohm·cm;
a dielectric layer on the mesoporous layer; and
a surface layer on the dielectric layer.

2. The semiconductor structure of claim 1, wherein the thickness of the mesoporous layer is less than 20 μm.

3. The semiconductor structure of claim 2, wherein the resistivity of the carrier substrate is between 1 ohm·cm and 2 ohm·cm.

4. The semiconductor structure of claim 3, wherein the surface layer comprises at least one material chosen from among the group consisting of silicon, germanium, silicon carbide, IV-IV, III-V or II-VI semiconductor compounds, or piezoelectric materials.

5. The semiconductor structure of claim 4, wherein the porosity of the mesoporous layer is between 40% and 60%.

6. The semiconductor structure of claim 5, further comprising radiofrequency devices in and/or on the surface layer.

7. The semiconductor structure of claim 1, wherein the resistivity of the carrier substrate is between 1 ohm·cm and 2 ohm·cm.

8. The semiconductor structure of claim 1, wherein the surface layer comprises at least one material chosen from among the group consisting of silicon, germanium, silicon carbide, IV-IV, III-V or II-VI semiconductor compounds, or piezoelectric materials.

9. The semiconductor structure of claim 1, wherein the porosity of the mesoporous layer is between 40% and 60%.

10. The semiconductor structure of claim 9, wherein the porosity of the mesoporous layer is about 50%.

11. The semiconductor structure of claim 1, further comprising radiofrequency devices in and/or on the surface layer.

12. A method of fabricating a semiconductor structure for radiofrequency applications, the method comprising:
- a step a) of providing a donor substrate including a buried weakened plane delimiting a surface layer with respect to a front face of the donor substrate;
- a step b) of providing a carrier substrate comprising silicon, the carrier substrate exhibiting a resistivity of between 0.5 ohm·cm and 4 ohm·cm;
- a step c) of porosifying the carrier substrate and forming a mesoporous layer in a front portion of the carrier substrate, the mesoporous layer exhibiting a resistivity higher than 20 kohm·cm, the mesoporous layer having a thickness between 3 μm and 40 μm;
- a step d) of annealing the carrier substrate under an oxidizing atmosphere at a temperature of between 300° C. and 400° C. to stabilize the mesoporous layer with hollow pores, internal walls of the hollow pores being coated with oxide, the hollow pores not being completely filled with a solid material;
- a step e) of depositing a dielectric layer on the mesoporous layer,
- a step f) of attaching the donor substrate, via the front face thereof, to the dielectric layer; and
- a step g) of separating the donor substrate along the buried weakened plane order to transfer the surface layer to the carrier substrate.

13. The method of claim 12, wherein the carrier substrate provided in step b) exhibits a resistivity of between 1 ohm·cm and 2 ohm·cm.

14. The method of claim 12, wherein the porosification in step c) is carried out electrochemically.

15. The method of claim 12, wherein a duration of the anneal under an oxidizing atmosphere in step d) is between 5 min and 200 min.

16. The method of claim 15, wherein step d) comprises, after the anneal under an oxidizing atmosphere, an anneal under a neutral atmosphere at a temperature of between 400° C. and 450° C.

17. The method of claim 16, wherein the duration of the anneal under a neutral atmosphere in step d) is between two hours and 16 hours.

18. The method of claim 12, wherein step g) comprises a separating heat treatment carried out at a temperature of between 200° C. and 500° C.

19. The method of claim 17, wherein the duration of the anneal under the neutral atmosphere in step d) is 10 hours.

20. The method of claim 18, wherein the separating heat treatment is carried out at a temperature of 400° C.

* * * * *

UNITED STATES PATENT AND TRADEMARK OFFICE
CERTIFICATE OF CORRECTION

PATENT NO. : 12,119,258 B2
APPLICATION NO. : 17/623499
DATED : October 15, 2024
INVENTOR(S) : Augendre et al.

It is certified that error appears in the above-identified patent and that said Letters Patent is hereby corrected as shown below:

In the Claims

| | | | |
|---|---|---|---|
| Claim 1, | Column 10, | Line 48, | change "solid material a thickness" to --solid material, a thickness-- |
| Claim 10, | Column 11, | Line 15, | change "layer is about 50%." to --layer is 50%.-- |
| Claim 12, | Column 12, | Lines 4-5, | change "mesoporous layer," to --mesoporous layer;-- |

Signed and Sealed this
Third Day of December, 2024

Katherine Kelly Vidal
*Director of the United States Patent and Trademark Office*